United States Patent [19]

David

[11] Patent Number: 5,161,199

[45] Date of Patent: Nov. 3, 1992

[54] ELECTRONIC AUDIO MEMORY WITH SINGLE ACTION SINGLE CONTROL

[76] Inventor: Mark P. David, 1700 Dover Rd., Apt., 108A, Delray Beach, Fla. 33445

[21] Appl. No.: 573,259

[22] Filed: Aug. 27, 1990

[51] Int. Cl.$^5$ ............................ G10L 3/00; G09B 7/02
[52] U.S. Cl. ........................................ 381/51; 434/167
[58] Field of Search ..................................... 381/51-53; 395/2; 364/709.16; 434/167, 169, 185; 369/22, 47, 127; 379/68, 70

[56] References Cited

U.S. PATENT DOCUMENTS

| | | | |
|---|---|---|---|
| 4,263,659 | 4/1981 | Hirata | 364/709 |
| 4,368,988 | 1/1985 | Tahara et al. | 381/51 |
| 4,389,541 | 6/1983 | Nakano | 381/51 |
| 4,567,567 | 1/1986 | Lapeyre | 364/709.16 |
| 4,680,725 | 7/1987 | Lapeyre | 364/709.16 |
| 4,698,776 | 10/1987 | Shibata | 395/2 |
| 4,706,288 | 11/1987 | Hashimoto et al. | 395/2 |
| 4,791,741 | 12/1988 | Kondo | 395/2 |
| 4,860,234 | 8/1989 | Lapeyre | 364/709.16 |

FOREIGN PATENT DOCUMENTS 3532259 12/1987 Fed. Rep. of Germany .

*Primary Examiner*—Michael R. Fleming
*Assistant Examiner*—Michelle Doerrler
*Attorney, Agent, or Firm*—Alvin S. Blum

[57] ABSTRACT

Small light weight voice recorder is worn by a user as a short term memory aid. It has a single, large, readily accessible control button on its front face. The device has two alternating operating modes, each of which is initiated by actuating the same button in the same way. In a first mode the device records a brief spoken message. In the second mode the message is played back. The device has all solid state components with no moving parts for durability, freedom from maintenance and low battery drain. It is especially useful for those with failing memory who may find the complexities and dexterity requirements of conventional recording devices beyond their capabilities. An alternative embodiment of the invention includes covered, rear mounted controls that are easily accessed and operated for playing back the recorded message at a preset time. This feature is designed to not interfere with the primary function of record and playback by alternate operation of a single button.

20 Claims, 2 Drawing Sheets

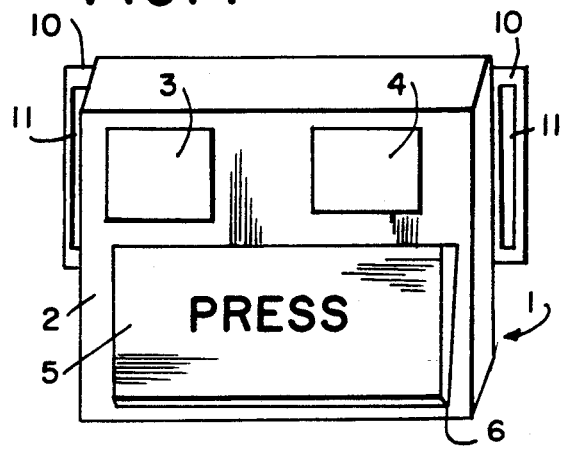
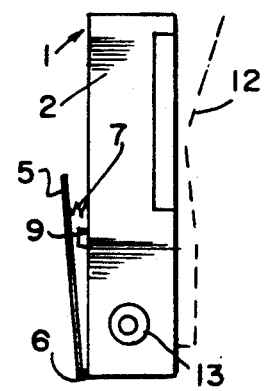
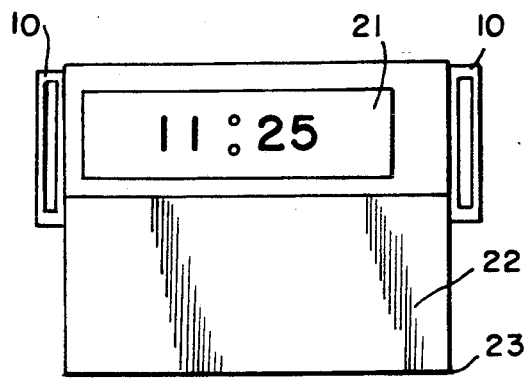
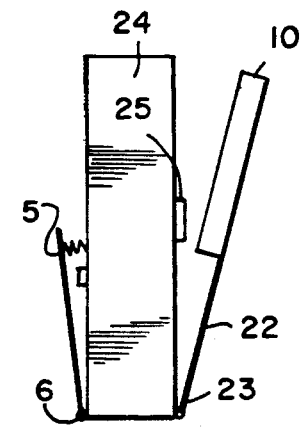
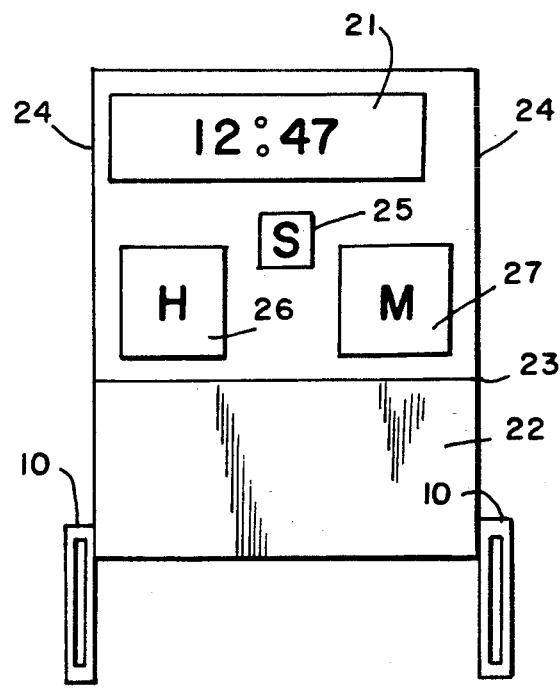

ELECTRONIC AUDIO MEMORY WITH SINGLE ACTION SINGLE CONTROL

This invention relates to audio recording and playback devices and more particularly to a small, portable device with a single operating control that records a brief voice message on alternate actuations of a control and plays back that message on the next actuation of the same control to recall a message that might be forgotten by a user with problems of memory, dexterity and mental function often seen in the elderly.

BACKGROUND OF THE INVENTION

Certain individuals have problems with short term memory recall and these problems generally increase with aging. It is very frustrating for these individuals to walk from one room to another for a purpose which has been forgotten by the time they reach the next room, for example.

One may carry a note pad or slate and write oneself messages. Alternatively, one may carry a small tape recorder and tape and playback messages. This requires manipulation of a number of different buttons in a correct sequence that may be awkward and time consuming or impossible for users with certain infirmities and involves a large, fragile and cumbersome device with many moving parts. The same patients with memory deficit may also have other mental and dexterity problems so that conventional recorders are quite beyond their abilities while their need for such a device is greatest.

SUMMARY OF THE INVENTION

It is accordingly an object of the invention to provide a very small, light, sturdy device without a plurality of moving parts that can be operated by a single operation that requires no vision skill or dexterity to fill a long felt need of the elderly.

The great improvement in solid state circuitry now makes it possible to store and playback short audio messages without moving parts such as tapes. The message is amplified. The string of analog signals that constitutes the message is converted to a string of digital signals, the digital signals are stored in digital memory circuits. All this takes place when a single large control button is pushed. The next time the same button is pushed in the same way, the digital information is removed from the memory circuits and converted back into a string of analog signals, amplified and used to drive a speaker that substantially reproduces the original sound so that the user hears his or her own voice repeating the message that needs to be recalled. The device thereby replaces short term memory. Because it does not use a moving tape, electric power requirements are low, and all the parts, including battery can be stored in conveniently small volume that is easily carried such as around the neck, clipped to the clothes or on a wristband. Optional accessory elements may include a timer to cause the recorded message to play back at a preset time. Any such control would not be on the face of the instrument where the single operate button is located so that it would not interfere or complicate the primary function.

These and other features, objects and advantages of the invention will become more apparent when the following detailed description is read in conjunction with the accompanying drawings.

BRIEF DESCRIPTION OF THE DRAWINGS

FIG. 1 is a perspective view of the front of the device.

FIG. 2 is a side elevation view of the device.

FIG. 3 is a rear elevation view of the model that includes playback at a preset time.

FIG. 4 is a side elevation view of the model of FIG. 3 with the back partially open.

FIG. 5 is a rear elevation view of the model of FIG. 3 with the back open for resetting of preset time.

DETAILED DESCRIPTION OF PREFERRED EMBODIMENTS

Figure 6:
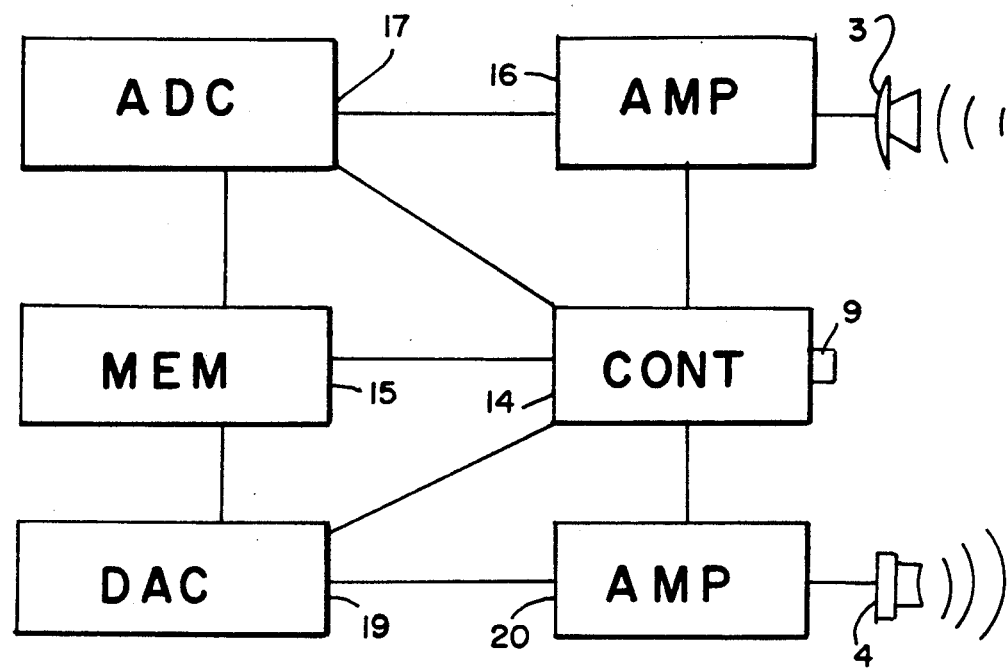
FIG. 6 is a block diagram showing principles of the system for automatic control by a single button.

Referring now first to FIGS. 1 and 2, front and side views respectively of the memory device 1 are shown. It can be made very small and light with special integrated solid state circuits, but it is preferably made with a front face at least one inch square so that it is easily handled. On the front face 2 microphone 3 and speaker 4 are mounted recessed or flush. A single large plate 5 is hingedly connected to the front face 2 by hinge 6. Spring 7 holds the plate 5 away from face 2 so that spring loaded switch 9 is not actuated until a substantial force is applied to plate 5. Two mounting ears 10 have slots 11 for receiving a chain or band so that the device may be worn around the neck as a pendant or at the waist or wrist. Alternatively, a spring clip 12 (shown in phantom) may be provided on the back for clipping to clothing. A battery charger inlet 13 may be provided if rechargeable batteries are used.

The device is easily worn and used. The large single button 5 is the only control visible to the user and the single operation is to press the button once and speak. For example, the button may be struck by the palm of the hand, or if worn on the wrist may be struck against a table. The next time the same button is pressed in the same way, the message will be repeated by the device. The device may provide a brief sound at the beginning and end of the recording interval to remind the user that it is time to talk. The total recording interval is fixed and short, for example eight or sixteen seconds, which is ample for this function.

Because there is no tape or other moving parts except for the switch and there are no tapes or motors to wear or tape heads to clean, the fidelity does not deteriorate, and there is no maintenance. The circuits draw very small currents and only during short use periods so that a small battery will last a long time and the device is resistant to trauma. These are important aspects because the device is provided for the user with failing memory who may not be capable of maintenance or care in handling.

Referring now to FIG. 6, a block diagram illustrates how the device operates. When switch 9 is actuated control 14 checks digital memory 15. If it has been reset, it actuates amplifier 16 and analog to digital converter 17 for the predetermined operating time interval. Sound such as the user's voice is converted to analog electric signal by microphone 3 and is amplified by input amplifier 16. Analog to digital converter 17 converts the amplified analog signal into a series of digital signals that are stored in digital memory 15.

The next time switch 9 is actuated, control 14 will check memory 15 and find that it is not reset. When that condition is found, control 14 activates digital to analog converter 19 and output amplifier 20. The memory contents are read out into the digital to analog converter 19 and the analog output signal is fed through output amplifier 20 to speaker 4 which converts the amplified analog signal into sound, reproducing the stored message. At the end of the interval, the digital memory 15 is reset so that the message is wiped out and ready for the next cycle of recording. The next time control 14 is actuated, it will find that memory is reset and it will begin a recording cycle. By this means, only a single pushbutton is used for control and every record cycle alternates with a playback cycle.

In an alternative embodiment of the invention, the above described simple operation is retained and another function is added to playback a recorded message at a specific time.

The front and side view of the device are shown in FIGS. 1 and 2 that are identical to the simpler model described above. The rear view of FIG. 3 is different from the plain back of the simpler model in that there is provided a liquid crystal time display 21 and an openable bottom portion 22 that includes ears 10 that hold the support band or chain. The openable portion 22 is hingedly connected by hinge 23 to the case and snaps tightly shut by the friction fit of the ears 10 against the sides 24 of the device. By simply pulling on the case, the back 22 may be opened without great manual dexterity. As shown in FIG. 5 wherein the back 10 is fully opened, three pushbuttons 25, 26 and 27 are exposed. Pushbutton 25 projects above the surface enough so that it is depressed whenever back 10 is closed. It is spring loaded so that it is released when the back is opened. Pushbuttons 26 and 27 are only actuated when they are pressed manually. When switch 25 is actuated, then LCD display 21 displays real time, so that the device can serve as a watch when the back 22 is closed. When switch 25 is not pressed, as when the back 22 is opened, LCD display 21 displays the preset time at which the stored message will be played back. When the switch 25 is in this position, then switch 26 controls the hours reading and switch 27 controls the minutes reading of preset time stored and displayed. To reset the real time of the device, switch 25 is manually depressed. This causes display 21 to display real time and switches 26 and 27 control hours and minutes respectively for readjustment of the real time.

Figure 7:
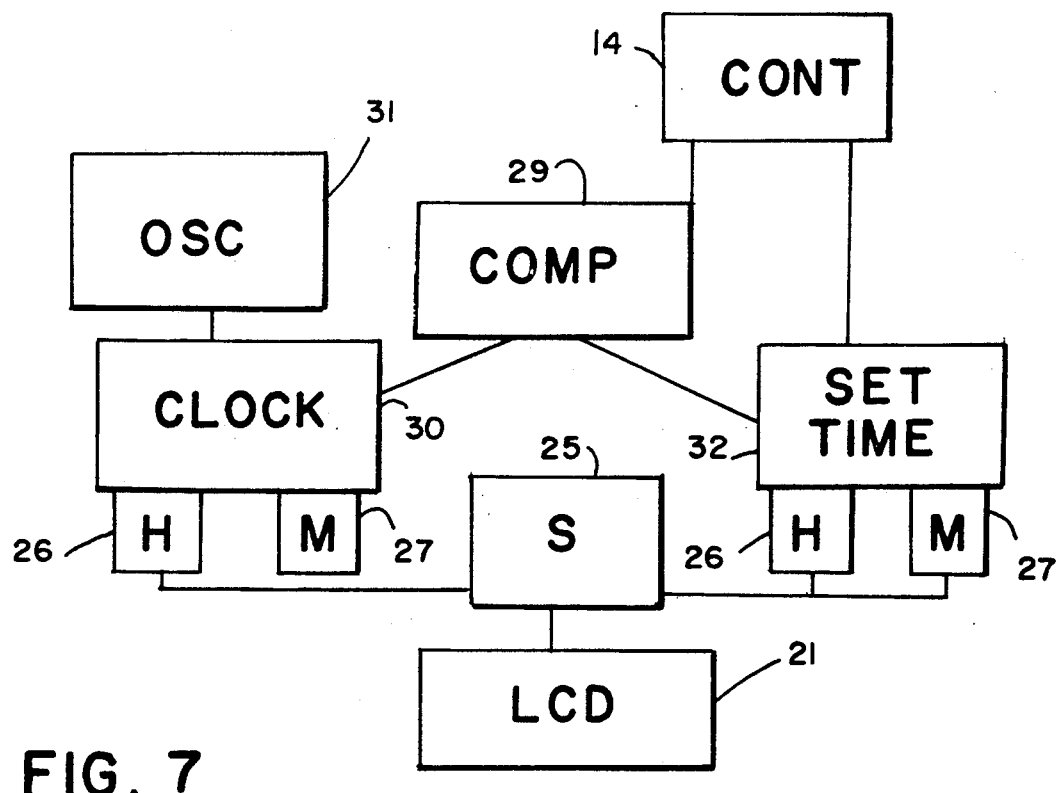
FIG. 7 is a block diagram showing other principles of the system for playback at a preset time.

FIG. 7 illustrates in block diagram form the extra operations performed by the preset time elements of the device. These in general are similar to the same functions and circuits found in digital wrist watches with alarm clock functions except that this activates the playback of a message. A built in real time clock 30 employs a crystal controlled oscillator 31 to maintain correct time and switches 26 and 27 can correct the time reading read out on LCD display 21 when switch 25 is depressed. When switch 25 is not depressed, switches 26 and 27 adjust the time stored in register 32 and displayed on LCD display 21. Comparator 29 compares the times stored in clock 30 and preset time register 32 and sends a signal to control 14 to playback the message when both times are the same. After the message is played, control 14 resets the preset time registers so that it will be inactive until another preset time is entered. By this means, the preset time function will not affect the primary function unless a time is freshly keyed in.

The above disclosed invention has a number of particular features which should preferably be employed in combination although each is useful separately without departure from the scope of the invention. While I have shown and described the preferred embodiments of my invention, it will be understood that the invention may be embodied otherwise than as herein specifically illustrated or described, and that certain changes in the form and arrangement of parts and the specific manner of practicing the invention may be made within the underlying idea or principles of the invention within the scope of the appended claims.

I claim:

1. A small light-weight memory device to supplement short-term memory that can be easily worn and operated by an unskilled or infirm user, said device having a first, recording mode for recording a brief spoken message and a second, playback mode for reproducing said message in audible form, said device comprising:
   a) microphone means for transforming said spoken message to an electrical input signal;
   b) recording means connected to said microphone means for storing said input signal in the form of a stable message record;
   c) reproducing means connected to said recording means for converting said message record into an electrical output signal;
   d) loudspeaker means connected to said reproducing means for transforming said output signal into an audible form;
   e) a single manual actuating means operable by a same single motion of said user;
   f) control means connected to said recording means and said reproducing means and also connected to said actuating means, said control means initiating said first, recording mode for a brief time period every other time said control means is actuated by said actuating means and initiating said second, playback mode for a brief time interval every other time said control means is actuated by said actuating means so that the same actuating means alternately initiates recording and playback intervals when actuated by said same single motion of said user; and
   g) a protective enclosure having a front face, back and sides enclosing said recording and reproducing means, said manual actuating means being mounted upon said front face for enhanced operation, and said front face being limited to supporting said single manual actuating means as the only manually operable device thereon for ease of operation by handicapped users.

2. The memory device according to claim 1, in which said actuating means is a single large pushbutton means on said front face that is readily accessible to said user.

3. The memory device according to claim 1, in which said time interval is less than thirty seconds.

4. The memory device according to claim 1, in which said recording means includes analog to digital converter means and digital storage means and said reproducing means includes digital to analog converter means.

5. The memory device according to claim 4, in which said actuating means is a single large pushbutton means on said front face that is readily accessible to said user.

6. The memory device according to claim 5, in which said message record is stored in a memory device that is reset by said control means at the conclusion of said second, playback mode and said control means checks said memory device when actuated by said actuating means to determine if said memory device is reset to decide whether to initiate said first or said second mode.

7. The memory device according to claim 5, further comprising:
   a) real-time clock means for registering real time;
   b) preset time means for registering a time at which said message record is to be played back;
   c) digital display means alternatively connected by switch means either to said real-time clock means or to said preset time means for displaying either said real time or said preset time to said user; and
   d) said control means connected to said clock means and said preset time means, said control means further including means for initiating said second, playback mode when said clock time and said preset time coincide.

8. The memory device according to claim 7, in which said control means includes means to reset said preset time means after said playback mode is operated to prevent repeat operation of preset function until said preset time is reset.

9. The memory device according to claim 8, in which said switch means and said preset time means are on said back and covered by a cover means when not being operated by said user.

10. The memory device according to claim 9, in which said cover means includes attaching means for attaching to said user for ease of operation of said cover.

11. The memory device according to claim 1, in which said enclosure includes spring clip means for attaching to the clothing.

12. The memory device according to claim 1, in which said enclosure includes attaching means for attaching to bands, cords or chains for convenience in wearing by said user.

13. The memory device according to claim 1, further including electric battery means enclosed in said enclosure and connected to said recording and reproducing means for providing electric power.

14. The memory device according to claim 1, further comprising:
   a) real-time clock means for registering real time;
   b) preset time means for registering a time at which said message record is to be played back;
   c) digital display means alternatively connected by switch means either to said real-time clock means or to said preset time means for displaying either said real time or said preset time to said user; and
   d) said control means connected to said clock means and said preset time means, said control means further including means for initiating said second, playback mode when said clock time and said preset time coincide.

15. The memory device according to claim 14, in which said control means includes means to reset said preset time means after said playback mode is operated to prevent repeat operation of preset function until said preset time is reset.

16. The memory device according to claim 15, in which said switch means and said preset time means are on said back and covered by a cover means when not being operated by said user.

17. The memory device according to claim 16, in which said cover means includes attaching means for attaching to said user for ease of operation of said cover.

18. The memory device according to claim 1, in which said message record is stored in a memory device that is reset by said control means at the conclusion of said second, playback mode and said control means checks said memory device when actuated by said actuating means to determine if said memory device is reset to decide whether to initiate said first or said second mode.

19. A small light-weight memory device to supplement short-term memory that can be easily worn and operated by an unskilled or infirm user, said device having a first, recording mode for recording a brief spoken message and a second, playback mode for reproducing said message in audible form, said device comprising:
   a) microphone means for transforming said spoken message to an electrical input signal;
   b) recording means connected to said microphone means for storing said input signal in the form of a stable message record;
   c) reproducing means connected to said recording means for converting said message record into an electrical output signal;
   d) loudspeaker means connected to said reproducing means for transforming said output signal into an audible form;
   e) a single manual actuating means operable by a same single motion of said user, said actuating means operatively connected to said recording means and said reproducing means, said actuating means initiating said first, recording mode for a brief time interval every other time said actuating means is actuated and said actuating means alternately initiating said second, playback mode every other time said actuating means is actuated by said motion, so that the same said motion alternately initiates recording and playback intervals when actuated by the same said motion;
   f) a protective enclosure having a front face, back and sides enclosing said recording and reproducing means, said manual actuating means being mounted upon said front face for enhanced operation, and said front face being limited to supporting said single manual actuating means as the only manually operable device thereon for ease of operation by handicapped users.

20. The memory device according to claim 19, in which said actuating means is a single large pushbutton means on said front face that is readily accessible to said user.

* * * * *